United States Patent [19]

Atwater

[11] Patent Number: 4,931,103

[45] Date of Patent: Jun. 5, 1990

[54] TRICHOLINE PHOSPHATE SURFACE TREATING AGENT

[75] Inventor: Charles B. Atwater, Springfield, Mo.

[73] Assignee: E. I. du Pont de Nemours and Company, Wilmington, Del.

[21] Appl. No.: 230,951

[22] Filed: Aug. 11, 1988

[51] Int. Cl.$^5$ ................................................ B08B 3/08
[52] U.S. Cl. ......................................... 134/2; 134/29; 134/38; 134/42; 156/637; 156/655; 156/656; 156/665; 156/668; 252/79.5; 252/156; 252/541
[58] Field of Search ................ 134/2, 29, 38, 42; 156/637, 655, 656, 665, 668, 659.1; 252/79.5, 156, 541

[56] References Cited

U.S. PATENT DOCUMENTS

| | | | |
|---|---|---|---|
| 3,887,450 | 6/1975 | Giliano et al. | 204/159.15 |
| 4,202,703 | 5/1980 | Zuber et al. | 134/2 |
| 4,239,661 | 12/1980 | Muraoka et al. | 252/541 |
| 4,294,911 | 10/1981 | Guild | 430/326 |
| 4,339,340 | 7/1982 | Muraoka et al. | 252/79.5 |
| 4,379,830 | 4/1983 | Deutsch et al. | 430/309 |
| 4,464,461 | 8/1984 | Guild | 430/326 |
| 4,530,895 | 6/1985 | Simon et al. | 430/145 |
| 4,686,002 | 8/1987 | Tasset | 156/659.1 |

FOREIGN PATENT DOCUMENTS 1145190  4/1983  Canada ................................. 96/269

*Primary Examiner*—Asok Pal

[57] ABSTRACT

The use of tricholine phosphate, tris [(2-hydroxyethyl) trimethylammonium] phosphate as a surface treating agent employed during the manufacture of printed wire boards, semiconductors and the like, particularly as a stripper for photoresists and as a cleaner for silicon wafers, furnace tubes and the like.

19 Claims, No Drawings

TRICHOLINE PHOSPHATE SURFACE TREATING AGENT

FIELD OF THE INVENTION

This invention relates to a surface treating agent used during the manufacture of printed wire boards, semiconductors and the like. It is particularly useful as a stripper for photoresists. It is also useful for cleaning silicon wafers, furnace tubes and the like. In particular it relates to the use of tricholine phosphate, tris[(2-hydroxyethyl)trimethylammonium]phosphate in these roles.

BACKGROUND TO THE INVENTION

It has been known to prepare printed circuits, chemically-machined parts, etched articles and the like by first applying a thin layer of a photosensitive resist to the surface of a substrate. There are two types of resists available: negative-working and positive-working. A negative-working resist is initially soluble in its developer but, after exposure to light of the proper wave length, becomes hardened and insoluble. Positive-acting resists are initially insoluble but become soluble upon being exposed. Polymeric images are then formed by exposing the layer, imagewise, to actinic radiation. Exposed or unexposed areas of the layer, as the case may be, are removed to form a resist image of polymeric material. The areas left unprotected by the resist image are permanently modified by being etched or having material deposited thereon. Finally, the remaining resist is stripped from the part.

U.S. Pat. No. 3,887,450 (Giliano et al.) describes using alkaline aqueous solutions as developers for negative-working photoresists. Among a large group of suggested bases, tetrasubstituted ammonium hydroxide and basic soluble salts thereof are disclosed. Strong alkalies or proprietary stripping formulas are taught for stripping.

U.S. Pat. No. 4,379,830 (Deutsch et al.) describes an improved alkaline developer for positive-working photoresists employing bases made from, among a list of anions, phosphates, and among a list of cations, quaternary ammonium ions, together with at least one neutral salt.

U.S. Pat. No. 4,530,895 (Simon et al.) describes an alkaline developer for positive-working photoresists employing quaternary ammonium bases and salts thereof.

U.S. Pat. Nos. 4,294,911 and 4,464,461 (Guild) describe the use of an aqueous solution of quaternary alkanol ammonium hydroxide as a developing agent for positive-working photoresists and positive-working lithographic printing plates. They teach that these quaternary ammonium compounds decompose without stabilizers.

U.S. Pat. Nos. 4,239,661 and 4,339,340 (Muraoka et al.) describe the use of an aqueous solution of trialkyl(-hydroxyalkyl) ammonium hydroxide, preferably choline base, as a cleaning agent for semiconductor wafers, as an etchant for metal layers used as wiring, and as a developer and stripper for positive working photoresist films.

Choline, also known as choline base, (2-hydroxyethyl)trimethylammonium hydroxide, is a well-known organic base suitable for stripping photoresist and for a variety of other uses. Aqueous and lower-alcohol solutions of choline base are useful in electronic applications such as photoresist developing and stripping, anisotropic etching, and cleaning.

Aqueous solutions typically are about 0.01 to 40 weight percent (wt.%) choline base. They are generally prepared and shipped as concentrates having at least 10 wt.% choline base. The concentrates are typically diluted to concentrations of about 1 to 5 wt.% choline base for use.

Solutions of choline base in lower alcohols such as methanol, in concentrations as high as 50 wt.% choline, have been suggested for use as replacements for (alcoholic) solutions of common alkalis, catalysts, curing agents, hydrolytic agents, neutralizing agents and solubilizing agents, as well as for pH control.

It has been hypothesized that when choline base contacts polymeric photoresists it partially decomposes into trimethylamine (TMA) and ethylene glycol and its oxidized decomposition products, creating adequate action to make it an effective stripping agent. Unfortunately, this results in extremely repugnant fishy odors, probably due to the TMA being released.

While some decomposition may be desired when the choline base contacts the polymeric photoresist, choline base's tendency to decompose, particularly during shipment and storage, has the unwanted consequences of darkening and changing its performance as a developing and stripping agent. To prevent or retard such decomposition with its consequences, inexpensive stabilizers that do not interfere with the intended use have been sought.

U.S. Pat. No. 4,686,002 teaches one such system for solutions of choline base in water and/or lower alcohols. Formaldehyde and paraformaldehyde are taught as improved stabilizers over the prior art stabilizers of sulfites and semicarbazides used in aqueous choline base and of the ethylenediamine, typically used in methanolic choline base.

But, stabilizers add to the cost of operation, only reduce the rate of decomposition and may be the source of unwanted ions that can have a deleterious effect on the electronic product being treated with the choline base. Tight limits for particular ions and residues that may be present are specified by the electronics industry. For example, in printed wire board manufacture, no residue following the normal post-bake period is allowed because even traces of impurities such as alkali metals would interfere in the operation of the electronic circuits.

It would be desirable to have a developer/stripper as effective as choline base, but which is stable without the addition of stabilizers that add cost, are only partially effective and impart undesirable ions or leave residues on the electronics workpiece and which doesn't have an extremely repugnant fishy odor.

SUMMARY OF THE INVENTION

In tricholine phosphate, tris[(2-hydroxyethyl)trimethylammonium]phosphate, a stripper/developer approaching the ideal has been found. It is fast acting; removes film in desirable particle sizes; does not readily decompose, particularly during storage and shipping, emitting odors and losing activity; is non-toxic, non-flammable and safe to handle; does not swell polymerized photoresist; leaves no residue or a residue that can easily be removed with an aqueous system; will not etch metals used in printed circuits; is relatively inexpensive; and is highly selective in its action.

The tricholine phosphate (TCP) is a completely ionized salt in an aqueous solution having a pH of about 12 at all practical concentrations. It can be used as a direct replacement for choline base as a stripper/developer and in other applications. Unlike choline base, TCP does not have the strong fishy odor and, as a fully ionized salt in an aqueous solution, is stable without the addition of stabilizers.

DETAILED DESCRIPTION OF THE INVENTION

This invention comprises the use of aqueous solutions of tricholine phosphate (TCP) as a surface treating agent for removing (developing and stripping) both positive-working and negative-working photoresists from substrates and for cleaning surfaces, particularly those encountered in the manufacture of printed wire boards and semiconductor intermediate products.

TCP is a fully ionized salt in water, having a pH of 11 to 13. The pH can be adjusted for the particular end use. Preferably, it should be about 12 within the range of end use concentrations.

TCP can be produced by reacting trimethylamine (TMA) with aqueous phosphoric acid at about 20°–60° C. and an autogenous pressure of about 10–50 pounds per square inch gauge (psig) to form trimethylamine phosphate salt. The temperature may be higher or lower depending on the pressure rating of the vessel in which the reaction is carried out and the time of reaction. Higher temperature will result in higher pressures and shorter reaction times. The trimethylamine phosphate salt in solution that is formed is then reacted in situ with ethylene oxide at about the same temperature and pressure as in the TMS-phosphoric-acid reaction to typically make up to about 50 wt.% TCP salt in water solution.

TCP can also be prepared by producing choline base in situ by reacting ethylene oxide and TMA in an aqueous solution and then reacting the choline base in situ with about ⅓ moles of phosphoric acid per mole of choline base. The temperatures and pressures for the production of choline base are about the same as in the TMA-phosphoric-acid-followed-by-ethylene-oxide method. The neutralization of the strong base with the weak phosphoric acid to form the alkaline salt can be carried out at ambient conditions.

TCP is preferably stored and shipped in a concentrated form, typically at least 15 to 30 wt.% TCP, to avoid the cost of shipping and storing excess wafer. The concentrate is diluted for use, as desired, to a sufficient concentration for accomplishing its particular intended surface treating purpose by adding other compounds typically used for that surface treating purpose.

Surfaces that can be treated include the interior of a quartz furnace tube, the surface of a wafer as sliced from an input, a wafer in which an impurity has been diffused, an oxide film produced on the wafer, a photoresist mounted on the surface of the wafer, and a metal layer deposited on the surface of the wafer, a printed wire board, a metal layer on the surface of the printed wire board, and a photoresist mounted on the surface of the printed wire board or metal layer thereon.

It may be used in removing any photoresist film of the type known to the semiconductor, printed wire board, and photolithographic industries that can be developed or stripped in alkali. These photoresists are of two main types: negative-working and positive-working.

It can be used as a direct replacement for choline base in these stripping/developing applications as well as in other applications for choline base, employing essentially the same treating conditions that would be used in the case of choline base. That is to say: the concentration of TCP as the principle alkaline component in the surface treating solution may be in about the same concentration range as choline base. By principle alkaline component, it is meant that the TCP will be the most highly alkaline component that provides the properties that enable faster action. The TCP should be compatible with the other components of the treating solution such as solvents, surfactants, buffers and metal complexing agents. These other components may be the same compounds present in the same concentration range as in the case of choline base. The temperature and time of operation should be about the same as in the case of choline base. Thus, from the details presented herein and in the references disclosed in the "Background of the Invention" and incorporated herein by reference, a person of ordinary skill in the art should be able to use the TCP aqueous solution of this invention in these applications.

As a developing agent for negative-working photoresists used primarily in printed wire board and printing applications, the TCP has limited utility due to the short time in which it strips polymerized resist. If it is to be used in this application, its concentration would have to be extremely low or its pH would have to be adjusted to less than 11 to reduce its stripping ability.

As a developing agent for positive-working photoresists used primarily in semiconductor applications, TCP should be as effective as choline base in the concentrations normally used for choline base. These concentrations are stated to be about 0.01 to 20 wt.%, more preferably 0.01 to 5 wt.%, especially 1 to 3 wt.%. The treating solution will contain, in addition to TCP and water, materials specific to and known to those skilled in the art for the particular photoresist. Treatment will preferably be by spraying or immersion and the temperature of the treating solution will depend upon the speed of the line, the photoresist used, the treating formulation and other factors. Temperatures of up to about 100° C., preferably 70° to 90° C. can be used. The pH of the solution will depend on the resists and conditions employed.

As a stripping agent, the concentration of TCP in the surface treating solution should again be about the same as in the case of choline base. The effective concentration will depend, upon line speed, temperature, the resist used and the other components and characteristics of the stripping mixture. Generally, the treating solution should contain as its principle alkaline component about 0.1 to 30 wt.% TCP. In printed wire boards, it is preferably as high as or higher than in semiconductor applications. In printed wire boards, it would be preferable greater than 1 and more preferably between 2 and 11 wt.%. In semiconductors, it would be preferably 1 to 3 wt.%, most generally about 2 wt.%. The treating solution preferably will contain, in addition to TCP and water, materials specific to and known to those skilled in the art for the particular photoresist. Temperatures of up to about 100° C., preferably 70° to 90° C. can be used. The pH of the solution again will depend on the resists and conditions employed, but typically, for currently known resists, will preferably be about 11 to 13 and more preferably about 12. Treatment will preferably be by spraying or immersion. Agitation as in an ultrasonic cleaner is preferable.

Where used as a surface cleaner of organic and inorganic contaminants on an intermediate product obtained in manufacturing a semiconductor device, the piece being washed by the TCP aqueous solution of the invention has only to be immersed 5 to 20 minutes in the solution kept at 70°–90° C. and, more preferably, is subjected to ultrasonic cleaning. The solution used in this case contains 0.1 to 30 wt.%, more preferably 0.2 to 10 wt.%, especially 0.5 to 5 wt.% of TCP.

When used for treating semiconductor intermediate products, the TCP aqueous solution is preferably substantially free of metal ions, that is, the alkali metal ion concentration is preferably less than 1 ppm, and more preferably as low as 0.01 ppm. The halide ion concentration is preferably then lower than 1 ppm, and more preferably lower than 0.01 ppm.

For non-semiconductor uses, the higher concentrations of both alkali metal and halide ions are permissible. For example, up to 10,000 ppm alkali metal ions may be present without interfering with the intended use.

The TCP aqueous solution of this invention is effective with both negative- and positive-working photoresists. As such, it will find its greatest use with negative-working photoresists in the printed wire board area where high speed exposing equipment is used and the photoresists are at least a half millimeter and generally 1 to 3 millimeters thick. It will find its greatest use with positive-working photoresists in the semiconductor area where the speed of exposure is sufficient because of the extremely thin coatings (micrometers thick) and because of their good resolving power and clear-cut image outlining.

For illustration of TCP's utility as a stripping-/developing agent, the remainder of the discussion will focus on positive-working resists and particularly on quinone diazide compounds which comprise the majority of positive-working photoresists. The examples will focus on the negative-working resists, in particular, the dry-film variety such as Riston ® and Laminar ® that are laminated onto the substrate.

The quinone diazides are extensively described in the patent literature as used in positive-working photoresists. The monomeric quinone diazide can be incorporated in an alkali-soluble resinous binder or reacted with an alkali-soluble resinous material so that it can be used satisfactorily as a resist material or can withstand the wear on printing plates.

Photosensitive polymeric compounds are formed from the condensation reaction of a quinone diazide such as 1,2-naphthoquinone-2-diazide-5-sulfonyl chloride with a phenol-formaldehyde resin.

The phenol-formaldehyde resins, such as novolac or resole resins, are described in Chapter XV of "Synthetic Resins in Coatings," H. P. Preuss, Noyes Development Corporation (1965), Pearl River, N.Y. Novolac resins are prepared by the condensation of phenols and aldehydes under acidic conditions whereas resole resins are prepared under basic conditions. More generally, they are produced by the reaction of a phenolic compound having two or three reactive aromatic ring hydrogen positions with an aldehyde or aldehyde-liberating compound capable of undergoing phenol-aldehyde condensation. The most suitable phenolic resins are those which are insoluble in water and trichloroethylene but readily soluble in conventional organic solvents such as methyl ethyl ketone, acetone, methanol, and ethanol. Phenolic resins having a particularly desirable combination of properties are those which have an average molecular weight in the range between about 350 and 40,000 and preferably in the range between about 350 and 2000, and preferred phenolic resins are cresol-formaldehyde and phenolformaldehyde.

Photosensitive compositions can be prepared as a solution of the photosensitive polymeric compound alone or mixed with film-forming non-photosensitive materials. The weight ratio of photosensitive polymer to non-light sensitive polymer can be in the range of about 1:1 to about 99:1. As the amount of quinone diazide used in a photosensitive composition is increased, the described amount of non-photosensitive polymer decreases.

The non-photosensitive polymers are typically addition homopolymers or interpolymers formed by the addition polymerization of one or more ethylenically unsaturated compounds, generally having a molecular weight in the range of 2000–50,000. They include polymers of vinyl amines, halides, esters, and the like, styrenes, acrylates, butadiene, chloroprene, etc. Other non-photosensitive polymers suitable for use in the present invention are film-forming condensation resins.

It will be recognized that additional components can be included in the coating compositions described herein. For example, dyes and/or pigments can be included to obtain colored images and resins, stabilizers and surface active agents can be utilized to improve properties such as film formation, coating properties, adhesion of the coatings to the supports employed, mechanical strength, and chemical resistance.

Photosensitive polymers in a liquid system can be placed onto a support or substrate in accordance with the usual practices such as by spraying, dipping or whirl-coating, and then drying the coating. If desired, a postbake of 10 to 30 minutes at 80°–100° C. is performed to remove residual solvent. Alternatively, they may be made into a preformed film of photoresist which may be laminated onto the substrate.

Concentrations of photosensitive polymer in the coating solutions are dependent upon the nature of the polymer, the supports and the coating methods employed. Particularly useful coatings are obtained when the coating solutions contain from about 0.05% to about 25% by weight of photosensitive polymer.

The support can also carry a filter or antihalation layer composed of a dyed polymer layer which absorbs the exposing radiation after it passes through the photosensitive layer and eliminates unwanted reflection from the support. A yellow dye in a polymeric binder, such as one of the polymers referred to above as suitable subcoatings, is an especially effective antihalation layer when ultraviolet radiation is employed as the exposing radiation.

The optimum coating thickness of a photosensitive layer will depend upon such factors as the use to which the coating will be put, the particular photosensitive polymer employed, and the nature of other components which may be present in the coating. Typically, the thickness for a semiconductor is in the micrometer range, whereas the thickness for printed wire board is a half millimeter, generally 1 to 3 millimeters.

The coating is then exposed imagewise (through a pattern) by conventional methods to a source of acitinic radiation which is preferably a source which is rich in ultraviolet light. Suitable sources include carbon arc lamps, mercury vapor lamps, fluorescent lamps, tungsten filament lamps, lasers, and the like.

The exposed elements can then be developed by spraying, flushing, soaking, swabbing, or otherwise treating the photosensitive layers with sufficient quantities of TCP aqueous surface treating solution of an adequate TCP concentration at a sufficient temperature for a sufficient time to remove the exposed areas of the coating while leaving the unexposed areas unaffected. The quantities, concentrations and temperature will vary as discussed earlier for semiconductor applications using positive-working photoresists.

The development time can vary widely depending on such factors as the strength of the solution, the particular photosensitive composition utilized, and the thickness of the photosensitive layer. The time can range from a few seconds to several minutes, most typically from about 30 seconds to about 120 seconds.

The developed image is rinsed with distilled water, dried and, optionally, post-baked for 15 to 30 minutes at 80°-120° C.

The exposed areas of the substrate can then be modified, for example, etched by an appropriate etching solution.

The unexposed areas can then be stripped by spraying, flushing, soaking, swabbing, or otherwise treating the photosensitive layers with sufficient quantities of TCP aqueous surface treating solution of an adequate TCP concentration at a sufficient temperature for a sufficient time to remove the unexposed areas of the coating while not effecting the modified substrate. Agitation such as by an ultrasonic bath preferably is used. The quantities, concentrations and temperature will vary as discussed earlier.

The concentration of TCP in the aqueous solution used in stripping may be 0.1 to 30 wt.%. That is, it may be the same as that used in developing if time of treating is longer but, generally, is at higher concentrations, for example, from about 1 to about 3 wt.% for semiconductors and from 1 to 11 wt.% or higher for printed wire boards.

The stripping time can vary widely depending on such factors as the concentration of TCP and other components in the solution, the particular photosensitive composition utilized, and the thickness of the photosensitive layer. The time can range from a few seconds to several minutes, most typically from about 30 seconds to about 120 seconds.

The invention is further illustrated, without limitation, by the following examples employing negative-working photoresists.

EXAMPLES

Example 1 is the method used to produce the tricholine phosphate (TCP) that was tested in the examples that are documented in Tables I through VI that follow. The TCP used was 27 weight percent (wt.%) TCP in water. The choline base, available from Syntex Agribusiness, Inc., was 45 wt.% choline base in methanol.

Examples 2 to 7 were screening tests made to evaluate the effectiveness of adding TCP to a typical blank solution used to remove photoresists versus the blank solution alone and the blank solution with choline base added.

Example 1

Distilled water (260 ml.) and 30 grams (gm.) 85 wt. phosphoric acid (30 gm.) were added to a 500 ml. Parr reactor in a shaker. Trimethylamine (53 gm.) was added rapidly with the temperature rising to about 40° C. and the pressure to about 16 psig. The pressure was then bled off and ethylene oxide (42 gm.) was slowly but steadily added from a cylinder. Pressure was periodically bled back to 0 psig. After addition of the ethylene oxide, the Parr reactor was shaken for an additional 20 minutes while cooling to complete the reaction. This procedure was repeated two times. Water (200 ml.) was added on one of the runs and the product from each of the runs was combined. The combined material was distilled in vacuo (distillation pot temperature was 68° C.) to remove any excess ethylene oxide and unreacted trimethylamine. Activated carbon was added, mixed and filtered out removing any polymers that may have been formed.

The above procedure was essentially repeated two more times and the product from each was combined with the above. The resulting product was analyzed using standard wet chemical methods for choline and phosphoric acid and was found to have 3.15 moles of choline per mole of phosphoric acid. The calculated amount of phosphoric acid to bring the ratio to 3 to 1 was added. The material was mixed for one and one half hours under vacuum with a slow nitrogen bleed and then reassayed. The ratio was found to be 3.04 moles of choline per mole of phosphoric acid. The concentration of the resulting tricholine phosphate solution was 27 wt.% TCP. A sample of the solution was diluted to a concentration of 5.4 wt.% TCP and the pH was measured and found to be 11.9.

EXAMPLES 2 TO 7

Blank solutions A, B and C containing no TCP or choline are solutions typical of those used to remove dry film photoresists. Blank C, however, does not normally remove dry film without the addition of an alkaline activator and therefore was not tested alone for stripping performance.

The dry films used in these examples are typical of those used in the printed wire board industry. Riston ® 218 is a negative-working, semi-aqueous-processable, photopolymer dry film resist and 3615 is a negative-working, aqueous-processable, photopolymer dry film resist available from E. I. du Pont de Nemours and Company. Laminar ® TA is a negative-working, aqueous-processable, photopolymer dry film resist and Laminar ® AX is a negative-working, semi-aqueous-processable, photopolymer dry film resist available from Morton Thiokol, Inc.

Since methanolic choline base is known to decompose slowly even if stabilized, laboratory stock choline base that had been stored for an extended period of time was compared to fresh methanolic choline base as received from the manufacturer just prior to the test in which it was used.

In each example, the dry film resist for each test was applied in the same thickness to a printed circuit substrate and similarly exposed to actinic radiation. It was then immersed in a bath maintained at 125±5° F. The time at which the film first began to lift (first time listed in the table), the time at which it was completely removed (last time listed) and the size of the removed particles were determined and are recorded in th tables.

The odors emanating from the baths were also observed. No objectionable fishy odor was generated by any bath containing the TCP, whereas such an odor was generated in those containing choline base.

Example 2

Table I compares the effectiveness of 100 milliliters (ml) of Blank A which consisted of 8 ml of 2-aminoethanol, 10 ml of 2-butoxyethanol and 82 ml of water, with Blank A modified by the addition of 1 and 2 ml of laboratory stock choline base in methanol (Stock Choline), by the addition of 1 and 2 ml of contemporaneously received choline base in methanol (Fresh Choline) and by 1 and 2 ml of tricholine phosphate in water (TCP). Percentages in the table are volume/volume percentages.

In the high amine, high glycol ether bath (Blank B), the addition of 1–2% (v/v) of 27 wt.% aqueous TCP was comparable to or only slightly less effective than with the addition of 1–2% (v/v) of 45 wt.% fresh methanolic choline base. While some difference in effectiveness on storage is apparent in the case of the methanolic choline base, TCP performance should not change on storage as the choline base, since the TCP is stable as a salt.

TABLE I

Tricholine Phosphate and Choline Base in High Amine, High Glycol Ether Solution

| Solution | Du Pont Riston ® 218 | | Dynachem Laminar ® AX | |
|---|---|---|---|---|
| | Stripping Time (min) | Particle Size (in) | Stripping Time (min) | Particle Size (in) |
| Blank A* | 3–3.25 | ⅛–¼ | 1.25–1.5 | 1/16–⅛ |
| Blank A + 1% Stock Choline | 2.25–2.5 | ⅛–¼ | 1.0–1.25 | 1/16 |
| Blank A + 2% Stock Choline | 2.0–2.25 | ⅛–¼ | 0.75–1.0 | 1/16 |
| Blank A + 1% Fresh Choline | 2.0–2.25 | ⅛–¼ | 1.0–1.25 | 1/16 |
| Blank A + 2% Fresh Choline | 1.75–2.0 | ⅛–¼ | 0.75–1.0 | 1/16 |
| Blank A + 1% TCP | 2.25–2.5 | ⅛–¼ | 1.0–1.5 | 1/16 |
| Blank A + 2% TCP | 2.25–2.5 | ⅛–¼ | 1.0–1.25 | 1/16 |

*Blank A:
2-aminoethanol 8 ml
2-butoxyethanol 10 ml
water 82 ml

Example 3

Table II compares the effectiveness of 100 milliliters (ml) of Blank B which consisted of 4 ml of 2-aminoethanol, 2 ml of 2-butoxyethanol and 94 ml of water, with Blank B modified by the addition of 1 and 2 ml of laboratory stock choline base in methanol (Stock Choline), by the addition of 1 and 2 ml of contemporaneously received choline base in methanol (Fresh Choline) and by 1 and 2 ml of tricholine phosphate in water (TCP). Percentages in the table are volume/volume percentages.

In the moderate amine, low glycol ether bath (Blank B), the addition of 1–2% (v/v) of 27 wt.% aqueous TCP was comparable to the addition of 1–2% (v/v) of 45 wt.% fresh methanolic choline base. The TCP modified Blank performed better than the blank only at 2%.

TABLE II

Tricholine Phosphate and Choline Base in Moderate Amine, Low Glycol Ether Solution

| Solution | Du Pont Riston ® 3615 | | Dynachem Laminar ® TA | |
|---|---|---|---|---|
| | Stripping Time (min) | Particle Size (in) | Stripping Time (min) | Particle Size (in) |
| Blank B* | 1–1.25 | ⅛–¼ | 1.5–1.75 | ⅛–¼ |
| Blank B + 1% Stock Choline | 0.75–1.0 | ⅛ | 1.33–1.66 | 1/16–⅛ |
| Blank B + 2% Stock Choline | 0.75–1.0 | ⅛ | 1.25–1.5 | 1/16–⅛ |
| Blank B + 1% Fresh Choline | 1.0–1.25 | ⅛ | 1.5–2.0 | 1/16 |
| Blank B + 2% Fresh Choline | 0.75–1.0 | ⅛ | 1.33–1.66 | 1/16 |
| Blank B + 1% TCP | 1.0–1.25 | ⅛ | 1.5–2.0 | 1/16–⅛ |
| Blank B + 2% TCP | 0.75–1.0 | ⅛ | 1.33–1.75 | 1/16–⅛ |

*Blank B:
2-aminoethanol 4 ml
2-butoxyethanol 2 ml
water 94 ml

Example 4

Table III compares the effectiveness of 100 milliliters (ml) of Blank C which consisted of 10 ml of 2-butoxyethanol and 90 ml of water, with Blank C modified by the addition of 1 and 2 ml of contemporaneously received choline base in methanol (Fresh Choline) and by 1 and 2 ml of tricholine phosphate in water (TCP). Percentages in the table are volume/volume percentages.

In the high glycol ether bath (Blank C), the addition of 1–2% (v/v) of 27 wt.% aqueous TCP was better in the case of Riston ® 218 and comparable or slightly inferior in the case of Laminar to the addition of 1–2% (v/v) of 45 wt.% fresh methanolic choline base.

TABLE III

Tricholine Phosphate and Choline Base in High Glycol Ether Solution

| Solution | Du Pont Riston ® 218 | | Dynachem Laminar ® AX | |
|---|---|---|---|---|
| | Stripping Time (min) | Particle Size (in) | Stripping Time (min) | Particle Size (in) |
| Blank C* | Not Tested | | Not Tested | |
| Blank C + 1% Fresh Choline | 6.0–7.5 | 1/16 | 1.5–2.5 | 1/16 |
| Blank C + 2% Fresh Choline | 6.0–7.5 | 1/16 | 1.5–2.5 | 1/16 |
| Blank C + 1% TCP | 5.75–7.25 | 1/16 | 1.75–2.25 | 1/16 |
| Blank C + 2% TCP | 5.5–6.5 | 1/16 | 1.75–2.25 | 1/16 |

*Blank C:
2-butoxyethanol 10 ml
water 90 ml

Example 5–7

Since the choline base solution contained 45 wt.% of the active ingredient and the TCP only contained 27 wt.% of the active ingredient, higher volume percentages of TCP solution were added than the normal 1–2% to each of the blanks. The Riston ® and Laminar ® resists were tested in the solutions. Additions of TCP were continued in each case until the reduction in stripping time and particle size leveled off. As can be seen from the following tables, TCP performance is at least comparable, if not better, than that of choline base on a weight-of-active-ingredient basis.

Example 5 tests TCP in high amine, high glycol ether solution (Blank A). Results are shown in Table IV.

Example 6 tests TCP in moderate amine, low glycolether solution (Blank B). Results are shown in Table V.

Example 7 tests TCP in high glycol ether solution (Blank C). Results are shown in Table VI.

TABLE IV

| | Tricholine Phosphate in High Amine, High Glycol Ether Solution | |
|---|---|---|
| | Du Pont Riston ® 218 | |
| Solution | Stripping Time (min) | Particle Size (in) |
| Blank A* | 2.25–3.0 | ⅛–⅜ |
| Blank A + 2% TCP | 1.5–2.5 | ⅛–¼ |
| Blank A + 4% TCP | 1.5–2.0 | ⅛–¼ |
| Blank A + 6% TCP | 1.25–2.0 | ⅛–¼ |

*Blank A:
2-aminoethanol 8 ml
2-butoxyethanol 10 ml
water 82 ml

TABLE V

| | Tricholine Phosphate in Moderate Amine, Low Glycol Ether Solution | | | |
|---|---|---|---|---|
| | Du Pont Riston ® 3615 | | Dynachem Laminar ® TA | |
| Solution | Stripping Time (min) | Particle Size (in) | Stripping Time (min) | Particle Size (in) |
| Blank B* | 0.75–1.5 | ⅛–¼ | 1.5–1.75 | ⅛–1/16 |
| Blank B + 2% TCP | 0.75–1.0 | 1/16–⅛ | 0.75–1.25 | 1/32–1/16 |
| Blank B + 4% TCP | 0.75–1.0 | 1/16 | 0.75–1.0 | 1/32 |
| Blank B + 6% TCP | 0.75–1.25 | 1/16 | 0.75–1.25 | 1/64–1/32 |

*Blank B:
2-aminoethanol 4 ml
2-butoxyethanol 2 ml
water 94 ml

TABLE VI

| | Tricholine Phosphate in High Glycol Ether Solution | | | | | |
|---|---|---|---|---|---|---|
| | Du Pont Riston ® 218 | | Du Pont Riston ® 3615 | | Dynachem Laminar ® TA | |
| Solution | Stripping Time (min) | Particle Size (in) | Stripping Time (min) | Particle Size (in) | Stripping Time (min) | Particle Size (in) |
| Blank C* | Not Tested | | Not Tested | | Not Tested | |
| Blank C + 2% TCP | 4.25–5.75 | ⅛–¼ | 1.0–1.25 | ⅛–¼ | 1.5–1.75 | ⅛–¼ |
| Blank C + 4% TCP | 3.0–4.25 | ⅛ | 1.0–1.25 | ⅛–¼ | 1.25–1.5 | ⅛–¼ |
| Blank C + 6% TCP | 2.5–4.0 | 1/16 | 1.0–1.25 | ⅛–¼ | 1.0–1.25 | ⅛ |
| Blank C + 8% TCP | 2.5–4.5 | 1/16 | 0.75–1.0 | 1/16–⅛ | 1.0–1.25 | ⅛ |
| Blank C + 10% TCP | 2.5–4.0 | 1/32 | 0.75–1.25 | 1/16–⅛ | 1.0–1.25 | ⅛ |

*Blank C:
2-butoxyethanol 10 ml
water 90 ml

I claim:

1. A method of stripping a photoresist from a substrate, the photoresist having been exposed, imagewise, to an actinic radiation source, which comprises contacting the substrate having the photoresist thereon with sufficient surface treating solution at a temperature and for a time sufficient to remove the photoresist from the substrate, the solution containing an effective concentration of tricholine phosphate as a surface treating agent.

2. The method of claim 1, wherein the surface treating agent has a pH of 11 to 13.

3. The method of claim 2, wherein the pH is about 12.

4. The method of claim 1, wherein the photoresist is a negative-working photoresist, the photoresist having an exposed hardened portion.

5. The method of claim 1 wherein the photoresist film is a positive-working photoresist having a unexposed hardened portion.

6. The method of claim 4 or 5, wherein the substrate having the hardened portion of photoresist thereon is contacted with sufficient surface treating solution having an effective concentration of the surface treating agent at a sufficient temperature and for a sufficient time to strip the hardened portion without otherwise effecting the surface of the substrate.

7. The method of claim 6, wherein the pH of the surface treating agent is about 12.

8. The method of claim 4 or 5, wherein the concentration of tricholine phosphate in the surface treating solution is between about 0.01 and 30 wt.%.

9. The method of claim 8, wherein the substrate is a printed wire board and the concentration of tricholine phosphate in the surface treating solution is between about 1 and 30 wt.%.

10. The method of claim 9, wherein the concentration is between about 2 and 11 wt.%.

11. The method of claim 10, wherein the substrate is a semiconductor intermediate product and the concentration of tricholine phosphate in the surface treating solution is between about 0.01 and 3 wt.%.

12. The method of claim 11, wherein the concentration is between about 1 and 3 wt.%.

13. The method of claim 12, wherein the concentration is about 2 wt.%.

14. A method of cleaning the surface of a substrate which comprises contacting the surface of the substrate with a surface treating solution at a temperature and for a time sufficient to clean the surface of the substrate, the surface treating solution containing an effective amount of tricholine phosphate as a surface treating agent.

15. The method of claim 14, wherein the surface treating agent has a pH of 11 to 13.

16. The method of claim 15, wherein the pH is about 12.

17. The method of claim 14, wherein the concentration of the tricholine phosphate in the solution is about 0.1 to 30 wt.%.

18. The method of claim 15, wherein the concentration is about 0.2 to 10 wt.%.

19. The method of claim 18, wherein the concentration is about 0.5 to 5 wt.%.

* * * * *